(12) United States Patent
Kim et al.

(10) Patent No.: US 7,498,610 B2
(45) Date of Patent: Mar. 3, 2009

(54) HIGH POWER LED HOUSING AND FABRICATION METHOD THEREOF

(75) Inventors: Chang Wook Kim, Kyungki-do (KR); Seon Goo Lee, Kyungki-do (KR)

(73) Assignee: Samsung Electro-Mechanics Co., Ltd., Suwon, Kyungki-do (KR)

(*) Notice: Subject to any disclaimer, the term of this patent is extended or adjusted under 35 U.S.C. 154(b) by 149 days.

(21) Appl. No.: 11/325,322

(22) Filed: Jan. 5, 2006

(65) Prior Publication Data
US 2006/0180824 A1 Aug. 17, 2006

(30) Foreign Application Priority Data
Feb. 17, 2005 (KR) .................. 10-2005-0013249

(51) Int. Cl.
*H01L 33/00* (2006.01)

(52) U.S. Cl. .................. 257/99; 257/E33.075; 257/98; 257/100; 257/675; 257/676; 362/294; 362/800

(58) Field of Classification Search .............. 257/676, 257/E33.075, 98–100, E33.073, E33.066, 257/E33.057, E33.062, 675, 666, 712; 362/294, 362/800, 373; 361/704
See application file for complete search history.

(56) References Cited

U.S. PATENT DOCUMENTS 6,541,800 B2 * 4/2003 Barnett et al. .............. 257/98

2004/0075100 A1 4/2004 Bogner et al.
2006/0103012 A1 * 5/2006 Chin ..................... 257/712

FOREIGN PATENT DOCUMENTS

KR 2000-0035156 6/2006

OTHER PUBLICATIONS

Korean Intellectual Property Office, Office Action, mailed May 22, 2006.

* cited by examiner

*Primary Examiner*—Chris C. Chu
(74) *Attorney, Agent, or Firm*—Lowe Hauptman Ham & Berner

(57) ABSTRACT

An LED housing, in which a heat conducting part has a chip mounting area, a heat connecting area opposed to the chip mounting area and a neck between them. Fixing parts have first ends engaged with the neck. An electrical connecting part has a wire connecting area placed adjacent to the chip mounting area and an external power connecting area connected to the wire connecting area. A housing body of molding material integrally holds the heat conducting part, the fixing parts and the electrical connecting part while isolating the electrical connecting part from the heat conducting part. The LED housing fixes the neck of the heat conducting part at both sides, thereby stably coupling the heat conducting part to the housing body. The fixing parts can spread heat from the heat conducting part to lateral regions of the LED housing, thereby more efficiently spreading heat.

9 Claims, 14 Drawing Sheets

HIGH POWER LED HOUSING AND FABRICATION METHOD THEREOF

CLAIM OF PRIORITY

This application claims the benefit of Korean Patent Application No. 2005-13249 filed on Feb. 17, 2005, in the Korean Intellectual Property Office, the disclosure of which is incorporated herein by reference.

BACKGROUND OF THE INVENTION

1. Field of the Invention

The present invention relates to an LED housing and a fabrication method thereof. More particularly, the LED housing of the present invention can securely fix a neck of a heat conducting part at both sides with a pair of fixing parts, thereby stably coupling the heat conducting part to a housing body made of resin, while allowing the fixing parts to spread heat from the heat conducting part to lateral regions of the LED housing, thereby more efficiently spreading heat within the LED housing.

2. Description of the Related Art

A Light Emitting Diode (LED) is a semiconductor device that is activated in response to electric current to generate various colors of light. The color of light generated by the LED is mainly determined by chemical components of LED semiconductor. Such LEDs have several merits such as longer lifetime, lower driving voltage, better initial activation characteristics, higher vibration resistance and higher tolerance on repetitive power switching over conventional lighting devices using filaments, and thus demand for them is gradually on the rise.

In particular, some LEDs such as high power LEDs are recently adopted in illumination systems and backlight units for large-sized Liquid Crystal Displays (LCDs). Such high power LEDs are required to have superior thermal radiation performance because these systems or units require larger power.

FIG. 1 illustrates a typical high power LED package, in which FIG. 1(a) is a perspective cross-sectional view of the high power LED, and FIG. 1(b) is a cross-sectional view of the high power LED mounted on a circuit board.

Referring to FIG. 1(a) first, an LED package 10 includes a thermal connecting member 14 (so-called heat slug) with an LED chip 12 seated thereon. The thermal connecting member 14 also functions as heat guide means. The LED chip 12 is powered from an external power source (not shown) via a pair of wires 16 and a pair of leads 18. An encapsulant 20 encapsulates the top portion of the thermal connecting member 14 including the LED chip 12, and a lens 22 is capped on the encapsulant 20. A housing 24 is formed typically by molding, surrounding the thermal connecting member 14 to support the thermal connecting member 14 and the leads 18.

The LED package 10 shown in FIG. 1(a) is mounted on a mother board 30 as a heat sink as shown in FIG. 1(b) to constitute an LED assembly 40. A heat conductive pad 36 such as solder is interposed between the heat conducting member 14 of the LED package 10 and a metal body 32 of the main board 30 to promote heat conduction between them. In addition, the leads 18 are also stably connected to a circuit pattern 34 of the main board 30.

The LED package 10 and its mounting structure on the main board 30 as shown in FIG. 1 are focused to thermal radiation to efficiently radiate heat to the outside. That is, the LED package 10 is so designed that the thermal connecting member 14 as a heat sink is mounted directly or via the thermal conductive pad 36 on the main board 30 in order to radiate heat absorbed from the LED chip 12 to the outside. Then, a major quantity of heat from the LED chip 12 is conducted through the thermal connecting member 14 to the main board 30 and only a minor quantity of heat is radiated to the air through the surface of the LED package 12 including the housing 24 and the lens 22.

However, this structure is disadvantageously complicated to obstruct the automation of LED package fabrication as well as require a large number of components to be assembled together, thereby burdening manufacture cost.

FIG. 2 illustrates a leadframe structure of a high power LED package disclosed by US Patent Application Publication No. 2004/0075100. Referring to FIG. 2, a leadframe 2 and a thermal conducting part 4 are shown. The leadframe 2 is subdivided into two electrical connecting parts 12a and 12b, which end in a respective solder connecting strip 3a, 3b.

One electrical connecting part 12a has an opening in the form of an eye. The thermal connecting part 4 is linked into the eye opening. The thermal connecting part 4 is substantially rotationally symmetrical and has projections 19 that allow the leadframe 2 to be anchored in a robust manner in a housing. Furthermore, the thermal connecting part 4 has a central recess in the form of a reflector well 16, on whose base surface a chip-mounting area 11 is provided for holding a radiation-emitting chip. The side surfaces of the recess are used as reflector surfaces.

The eye ring of the electrical connecting part 12a has a cutout 13, at which a bonding wire connecting area 10, which is in the form of a tongue, of the second electrical connecting part 12b overlaps. The bonding wire connecting area 10 is disposed at a different height to that edge of the reflector well 16 that emits radiation. For chip mounting purposes, the configuration allows short wire connections between the chip and the bonding wire connecting area 10 without any need for a cutout for this purpose at the edge of the reflector well 16 in the thermal connecting part.

Herein the reference sign 27 designates the main radiation emission direction 27 of the component.

Such a leadframe structure can be fabricated in more simple process over the package structure illustrated in FIG. 1 since the package body can be molded from resin with the first electrical connecting part 12a inserted into the thermal connecting part 4.

However, this structure can be restrictively used for a structure where the electrical connecting part 12a is electrically connected to the thermal connecting part 4 since the electrical connecting part 12a directly contacts the thermal conductive part 4. This cannot be used for a structure requiring the electrical connecting part 12a insulated from the thermal connecting part 4.

Furthermore, this document does not teach any fabrication method of a package structure that can be used in such an insulated structure.

SUMMARY OF THE INVENTION

The present invention has been made to solve the foregoing problems of the prior art and it is therefore an object of the present invention to provide an LED housing which can securely fix a neck of a heat conducting part at both sides with a pair of fixing parts, thereby stably coupling the heat conducting part to a housing body made of resin, and allow the fixing parts to spread heat from the heat conducting part to lateral regions of the LED housing, thereby more efficiently spreading heat within the LED housing.

It is another object of the invention to provide a fabrication method of an LED housing which can fabricate an LED housing easily and stably by carrying out resin molding with a heat conducting part inserted into a pair of fixing parts of a frame to form a housing body, taking a resultant structure out of a mold when resin is cured, and separating the LED housing from the frame. This object is also aimed to use the frame with the fixing parts and an electrical connecting part formed therein as means for fixing the heat conducting part in order to automate fabrication, thereby saving cost and improving productivity.

In order to realize the foregoing objects, the invention provides an LED housing comprising: a heat conducting part having a chip mounting area for mounting a LED chip, a heat connecting area opposed to the chip mounting area and a neck formed between the chip mounting area and the heat connecting area; a pair of fixing parts each having a first end engaged with the neck of the heat conducting part to fix the heat conducting part; an electrical connecting part having a wire connecting area placed adjacent to the chip mounting area of the heat conducting part and an external power connecting area connected to the wire connecting area; and a housing body of molding material integrally holding the heat conducting part, the fixing parts and the electrical connecting part while isolating the electrical connecting part from the heat conducting part.

Preferably, the first end of the fixing parts is adapted to hold around the neck.

Preferably, the fixing parts may have a hole for receiving a portion of the housing body.

Preferably, each of the fixing parts may have a second end extended to a side surface of the housing body to spread heat from the heat conducting part in lateral direction of the housing body, and the housing body may have a caved-in side portion so that the second ends of the fixing parts are projected out of the housing body.

Preferably, the housing body may have a cavity Configured to expose the chip mounting area of the heat conducting part and the wire connecting area of the electrical connecting part. In this case, the housing body may have a step connected around the chip mounting area of the heat conductive area within the recess.

Furthermore, the housing body may have a groove connected around the heat connecting area of the heat conducting part.

In order to realize the foregoing objects, the invention also provides a fabrication method of a LED housing, comprising steps of:
(a) preparing a heat conducting part having a chip mounting area, a heat connecting area opposed to the chip mounting area and a neck formed between the chip mounting area and the heat connecting area;
(b) machining a sheet metal to prepare a frame having a circumference part, a pair of fixing parts and at least one electrical connecting part each having a first end extended from the circumference part toward the center of the frame, and a hole formed in the circumference part;
(c) assembling the heat conducting part to the frame to produce a heat conducting part-frame assembly, wherein the first ends of the fixing parts engage with the neck of the heat conducting part and a first end of the electrical connecting part is placed adjacent to the chip mounting area;
(d) mounting the heat conducting part-frame assembly in a mold;
(e) injecting molding material into the mold to form a housing body that integrally holds the heat conducting part, the fixing parts and the electrical connecting part while isolating the electrical connecting part from the heat conducting part; and
(f) cutting the fixing parts and the electrical connecting part from the frame.

In order to realize the foregoing objects, the invention also provides a fabrication method of a LED housing, comprising steps of:
(a) preparing a plurality of heat conducting parts each having a chip mounting area, a heat connecting area opposed to the chip mounting area and a neck formed between the chip mounting area and the heat connecting area;
(b) machining a sheet metal into a frame array sheet having a circumference area with holes and a plurality of frame areas surrounded by the circumference area, wherein each of the frame areas has a circumference part and a pair of fixing parts, and at least one electrical connecting part each having a first end extended from the circumference part toward the center of the frame;
(c) assembling the heat conducting parts to the frame array sheet to produce a plurality of heat conducting part-frame assemblies, wherein the first ends of the fixing parts engage with the neck of the heat conducting part and a first end of the electrical connecting part is placed adjacent to the chip mounting area;
(d) mounting the heat conducting part-frame assemblies in molds;
(e) injecting molding material into the molds to form a plurality of housing body each of which integrally holds the heat conducting part, the fixing parts and the electrical connecting part while isolating the electrical connecting part from the heat conducting part; and
(f) cutting the fixing parts and the electrical connecting part from the frame area sheet.

Preferably, the sheet metal machining step (b) may comprise punching the sheet metal.

Preferably, the heat conducting part assembling step (c) may comprise pushing the heat conducting part with the chip mounting area first between the opposed first ends of the fixing parts so that the first ends hold the neck of the heat conducting part.

Preferably, the heat conducting part-frame assembly mounting step (d) may comprise inserting a guide pin of the mold into the hole of the frame or frame array sheet to guide the mold.

Preferably, the molding material injecting step (e) is so carried out to expose the chip mounting area of the heat conducting part and the first end of the electrical connecting part.

The fabrication method of the invention may further comprise a step of: (g) curing the molding material and taking out a cured resultant structure before or after the cutting step (f)

Furthermore, the fabrication method of the invention may further comprise a step of: bending a portion of the electrical connecting part that is extended to the outside after the resultant structure taking out step (g).

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1A:
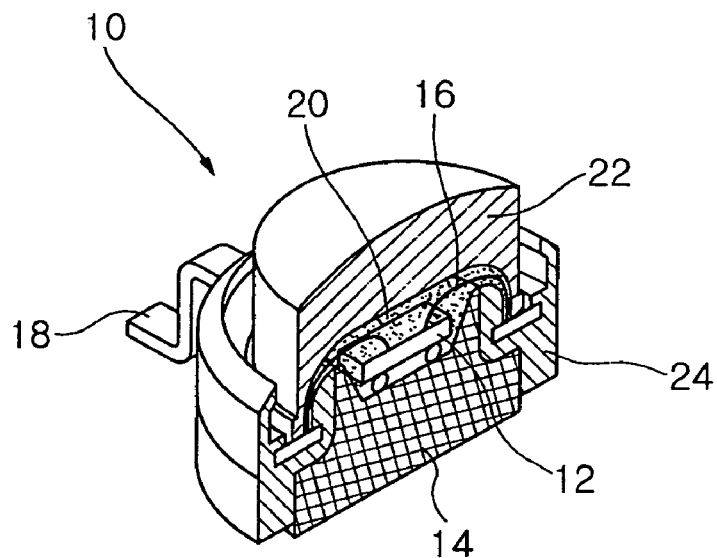
FIG. 1 is a sectional view of a general high power LED package and a mounting structure thereof.

Preferred embodiment of the present invention will now be described in detail with reference to the accompanying drawings.

Referring to FIGS. 3 to 7 first, an LED housing 100 of the invention includes a heat conducting part 110, a pair of fixing parts 120, a pair of electric connecting parts 120 and a housing body 150.

The heat conducting part 110 is made of a lump of metal preferably having high heat conductivity. The heat conducting part 110 has a chip mounting area 112 on which an LED chip (refer to FIG. 8) is mounted, a heat connecting area 114 opposite to the chip mounting area and a neck 116 of a reduced width between the chip mounting and heat connecting areas 112 and 114.

Figure 14:
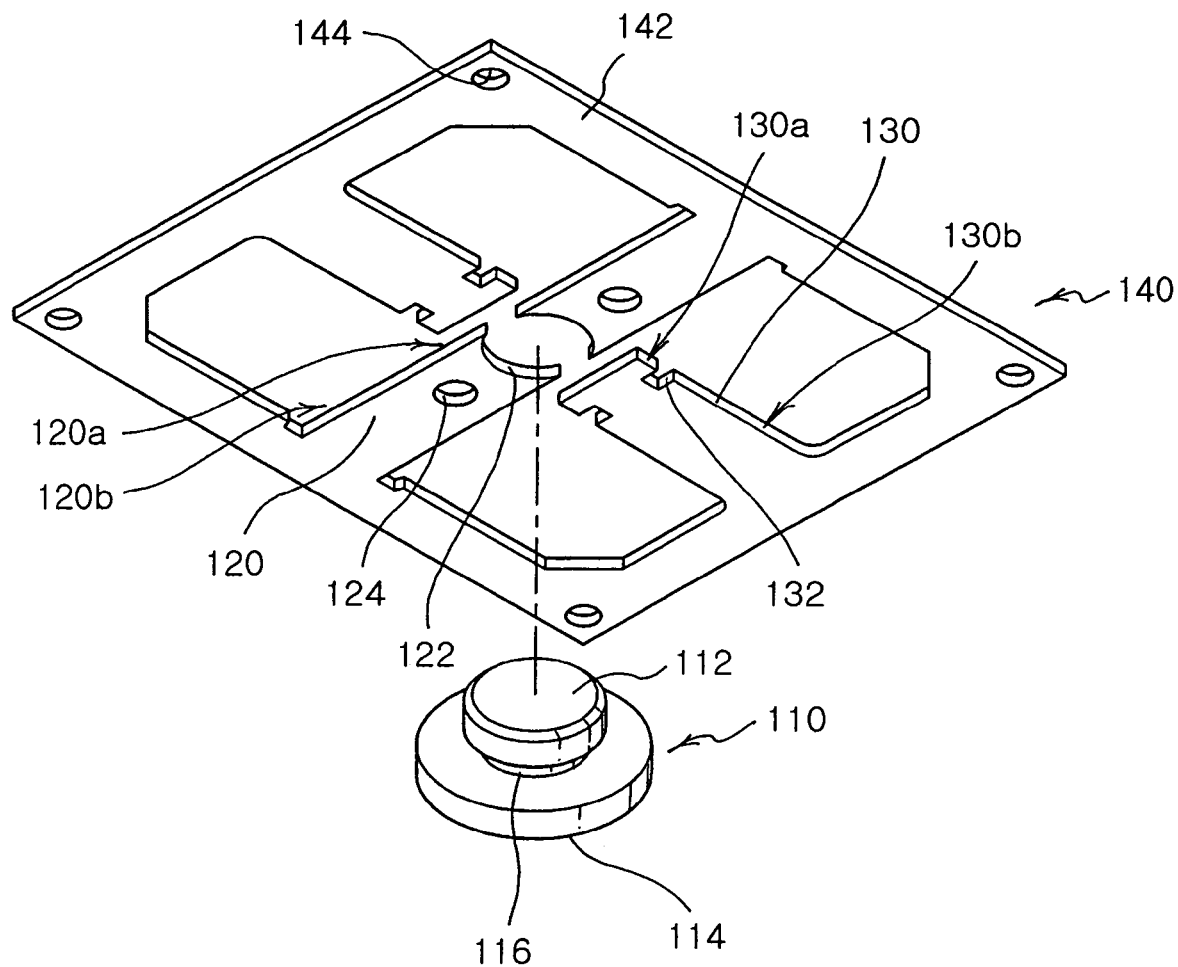
FIG. 14 is an exploded perspective view of a fabrication process of a high power LED housing according to the invention, illustrating a heat conducting part and a leadframe prior in position prior to being assembled together.

The fixing parts 120 each have a holder 122 formed at a first end 120a thereof inside the housing 100, engaged with the neck 116 of the heat conducting part 110. The holders 122 are curved inward with a curvature the same as that of the neck 116 as shown in FIG. 14 to hold the neck 116 at both sides, thereby fixing the heat conducting part 110. Furthermore, the fixing part 120 is led from the first end 120a to a second end 120b to spread heat from the heat conducting part 110 in lateral direction. Therefore, it is preferable that the fixing part 120 is made of high heat conductivity metal.

The second end of the fixing part 120 is exposed to the outside through a side recess 158 formed in a lateral portion of the housing body 150. The fixing part 120 has a hole 124 formed between the first end 120a and the second end 120b to receive a disk-like fixing area 154 of the housing body 150. As a result, the fixing part 120 is more tightly fixed to the housing body 150 thereby more securely fixing the heat conducting part 110.

As stated above, since the holder 122 at the first end 120a of the fixing part 120 is engaged with the neck 116 of the heat conducting part 110 and the hole 124 of the fixing part 120 is engaged with the fixing area 154 to securely fix the fixing part 120 to the housing body 150, the fixing part 120 securely fixes the heat conducting part 110. At the same time, the second end of the fixing part 120 is extended to the side surface of the housing body 150 thereby spreading heat from the heat conducting part 110 in lateral direction.

The heat conducting part 130 is made of a strip-shaped lead for electrical connection, and has a wire connecting area formed at a first end 130a thereof placed adjacent to the chip mounting area 112 of the heat conducting part 110 and an external power connecting area formed at the second end 130b extended outside the housing body 150. Indentations 132 are formed in portions of the electrical connecting part 130 adjacent to the first end 120a to house rectangular fixing portions 156 of the housing body 150. This makes the electrical connecting part 130 be securely coupled with the housing body 150.

The housing body 150 is integrally formed from molding compound so that it has a substantially flat box-like configuration. The housing body 150 integrally holds the heat conducting part 110, the fixing parts 120 and the electrical connecting parts 130 while isolating the heat conducting part 110 from the electrical connecting part 130.

In a central area of the upper part 150a of the housing body 150, there is provided a circular cavity C that is configured to expose the chip mounting area 112 of the heat conducting part 110, the fixing parts 120 in part adjacent to the first end 120a and the first end 130a of the electrical connecting part 130. The fixing portions 154 and 156 of the housing body 150 are also exposed upward through the cavity C.

The side recesses 158 are also formed in the side portions of the housing body 150 to expose the second ends of the fixing parts 120. In the lower part 150b of the housing body 150, an annular groove 160 is formed to expose the heat connecting area 114 of the heat conducting part 110.

Figure 8:
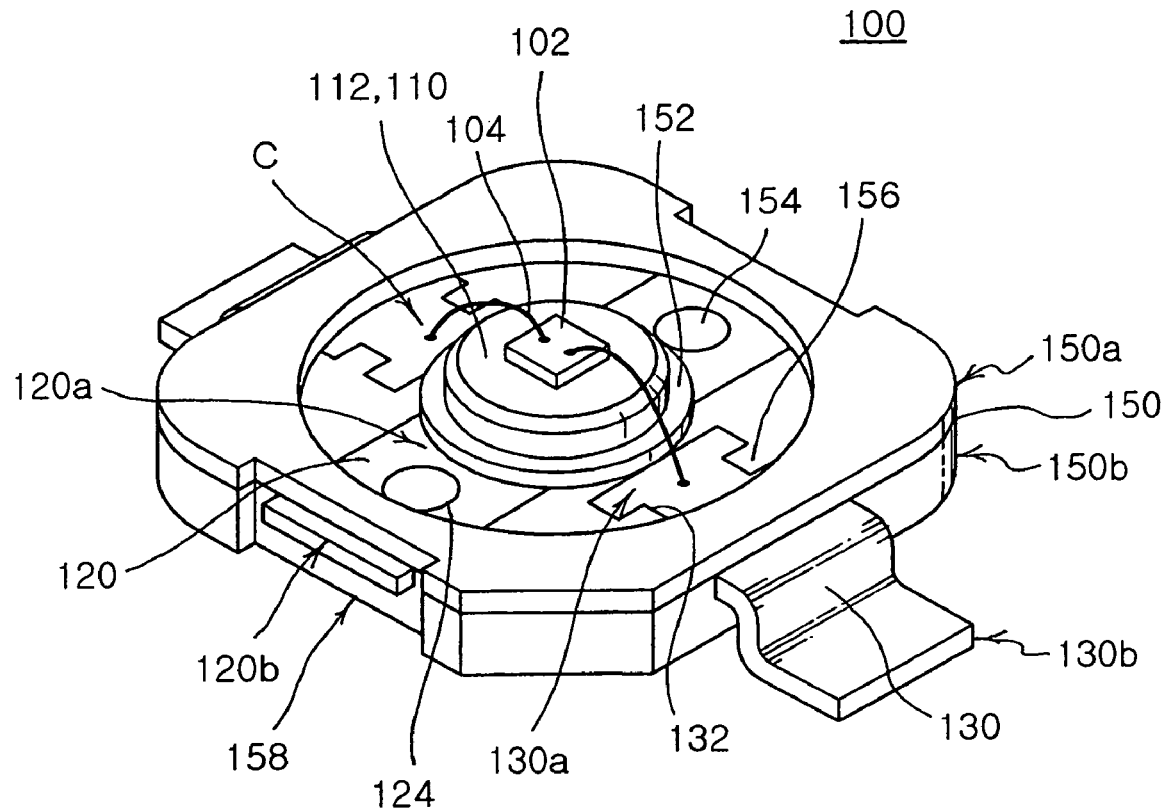
FIG. 8 is a perspective view of the LED housing shown in FIG. 3, mounted with an LED chip thereon.

FIG. 8 is a perspective view of the LED housing 100 mounted with an LED chip 102 thereon. Referring to FIG. 8, the LED chip 102 is mounted on the chip mounting area 112 of the heat conducting part 110 by for example adhesive, and connected to the first ends 130a of the electrical connecting parts 130 by wires 104. The electrical connecting part 130 is connected by the second ends 130b to an external power source (not shown) so that the LED chip 102 is supplied with power via the electrical connecting parts 130 and the wires 104.

Figure 3:
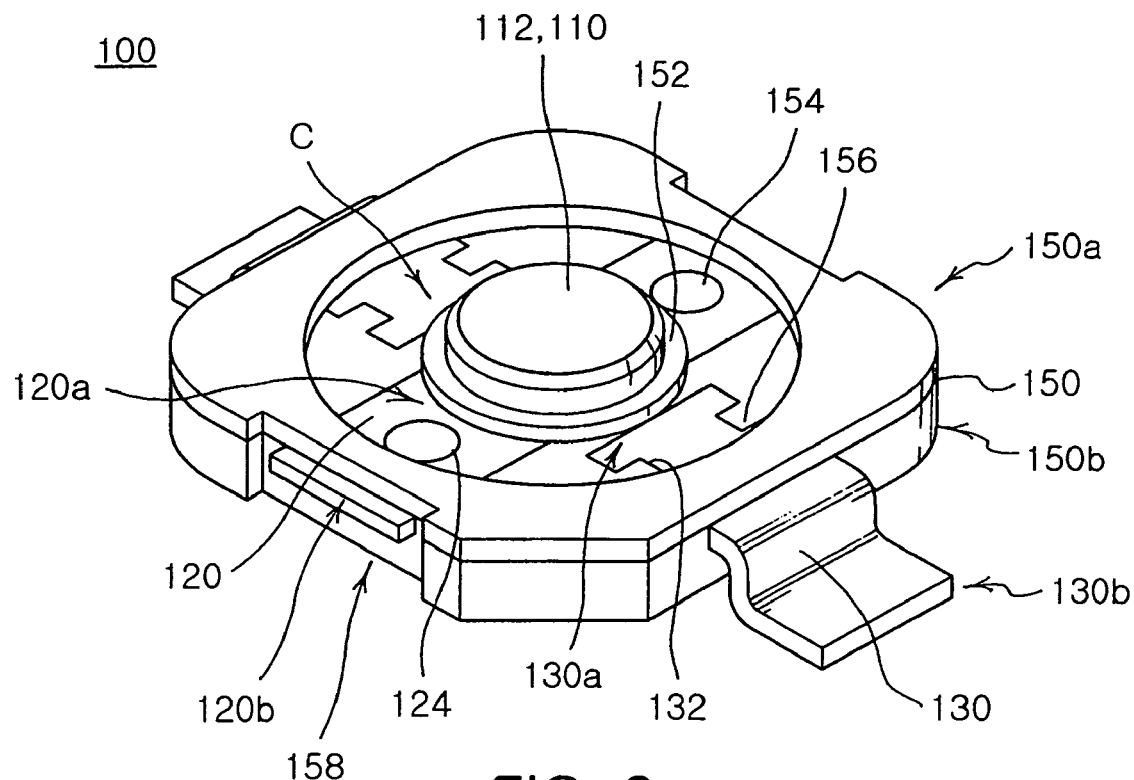
FIG. 3 is a perspective view of an embodiment of a high power LED housing according to the invention.
Figure 4:
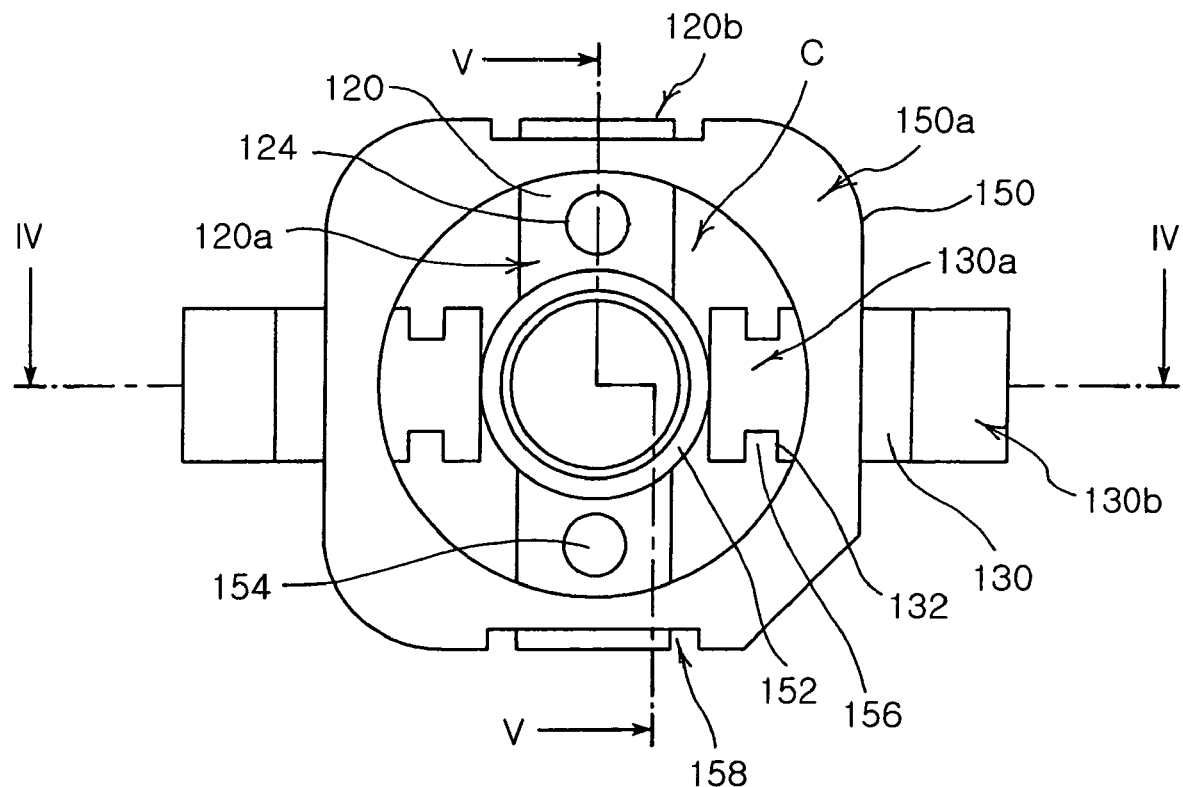
FIG. 4 is a plan view of the LED housing shown in FIG. 3.
Figure 5:
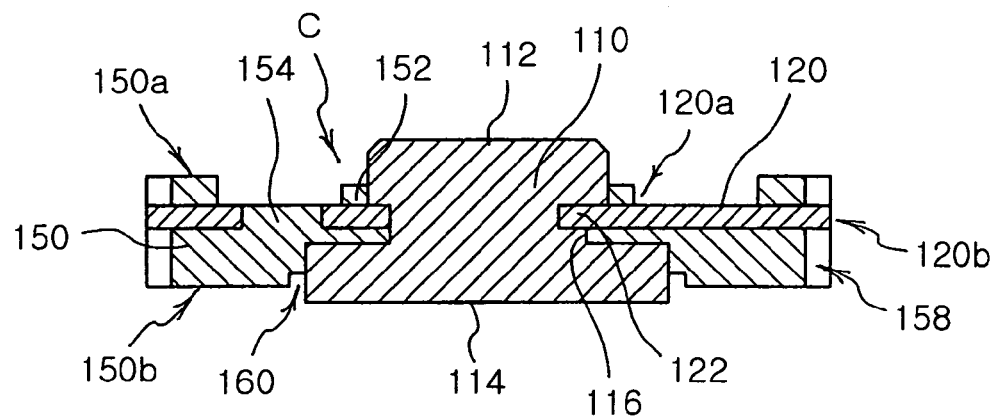
FIG. 5 is a cross-sectional view taken along the line V-V in FIG. 4.
Figure 6:
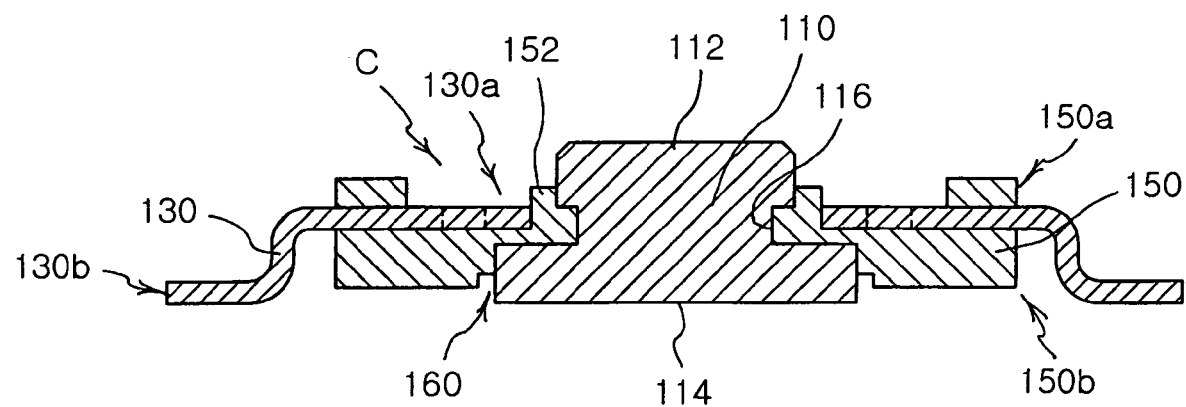
FIG. 6 is a cross-sectional view taken along the line VI-VI in FIG. 4.
Figure 7:
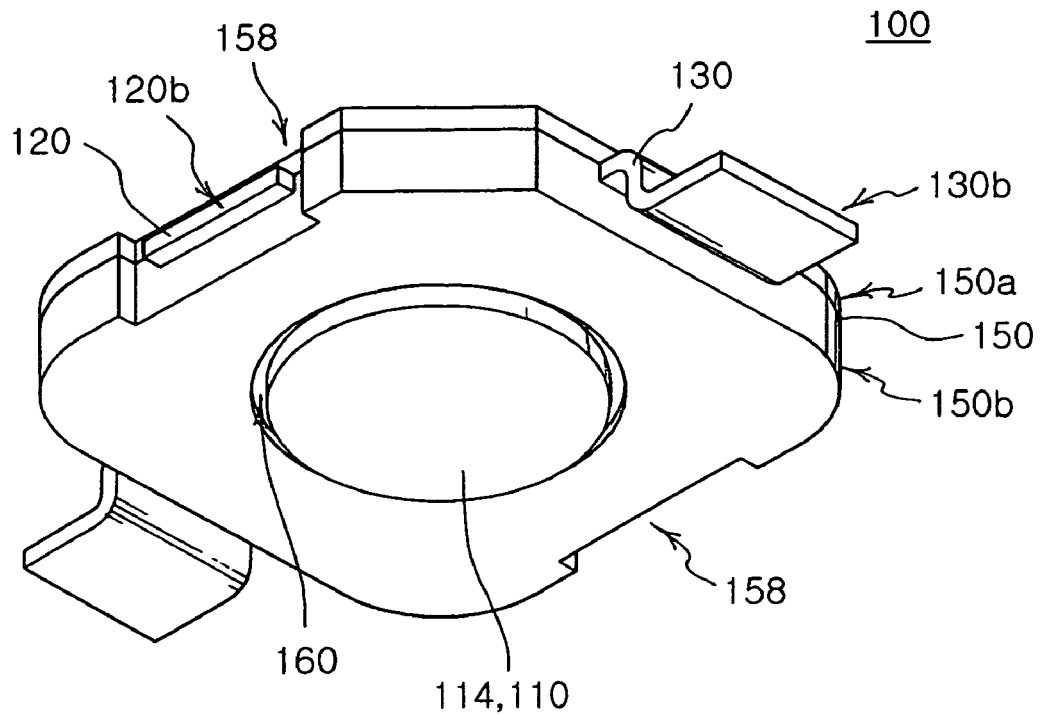
FIG. 7 is a bottom perspective view of the LED housing shown in FIG. 3.
Figure 9:
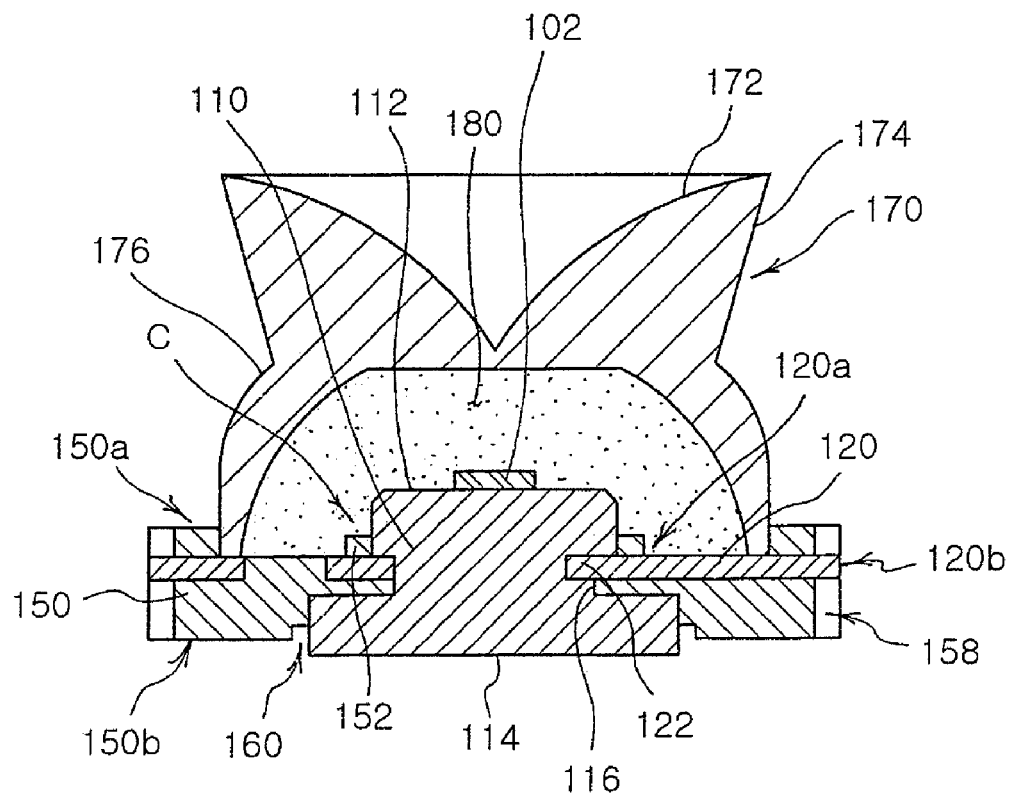
FIG. 9 is a cross-sectional view of a high power LED package of the invention having an LED housing as shown in FIG. 3.

FIG. 9 is a cross-sectional view of a high power LED package of the invention embodied by capping a transparent cover 170 on an LED housing 100 of the invention. The LED package of the invention shown in FIG. 9 includes the LED housing 100 the same as shown in FIG. 3, a cover 170 capped on the top of the LED housing 100 and a transparent encapsulant 180 filled into a cavity of the cover 170.

The cover 170 is a transparent lens made by injection molding of for example transparent plastic, and shaped symmetrically about the axis A. The cover 170 has a reflecting surface 172 for reflecting light generated from the LED chip 102, an upper radiating surface 174 for radiating reflection light to the outside and a lower radiating surface 176 extended downward from the upper radiating surface 174 to radiate light directly incident thereon from the LED chip 102 to the outside.

The transparent encapsulant provided between the cover 170 and the LED housing 100 is preferably made of elastic resin. The elastic resin may include gel type substance such as silicone which has not only excellent optical characteristic due to large refractive index but also excellent resistance against yellowing, that is, change in quality caused by single wavelength light. Furthermore, silicone maintains jell or elastomer state even after hardening, and thus can stably protect the LED chip 102 from stress, vibrations and external impact.

Figure 1B:
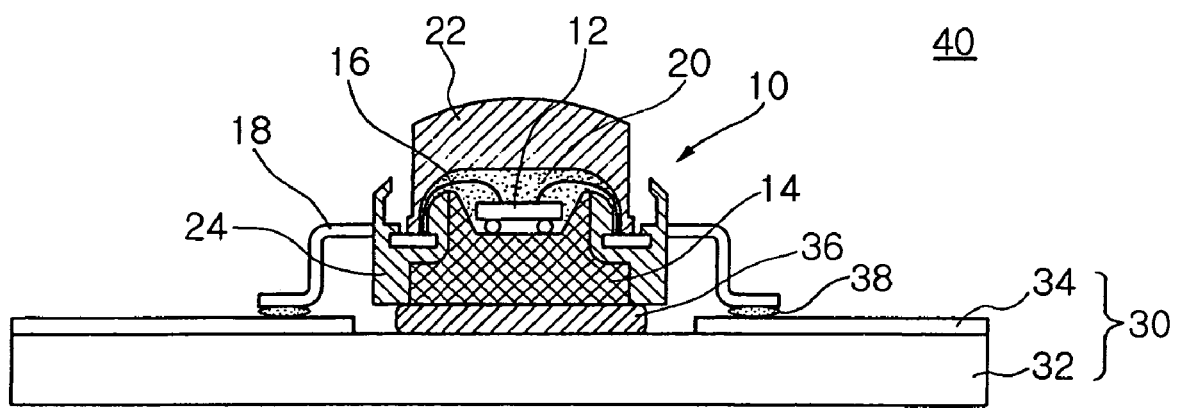
Figure 2A:
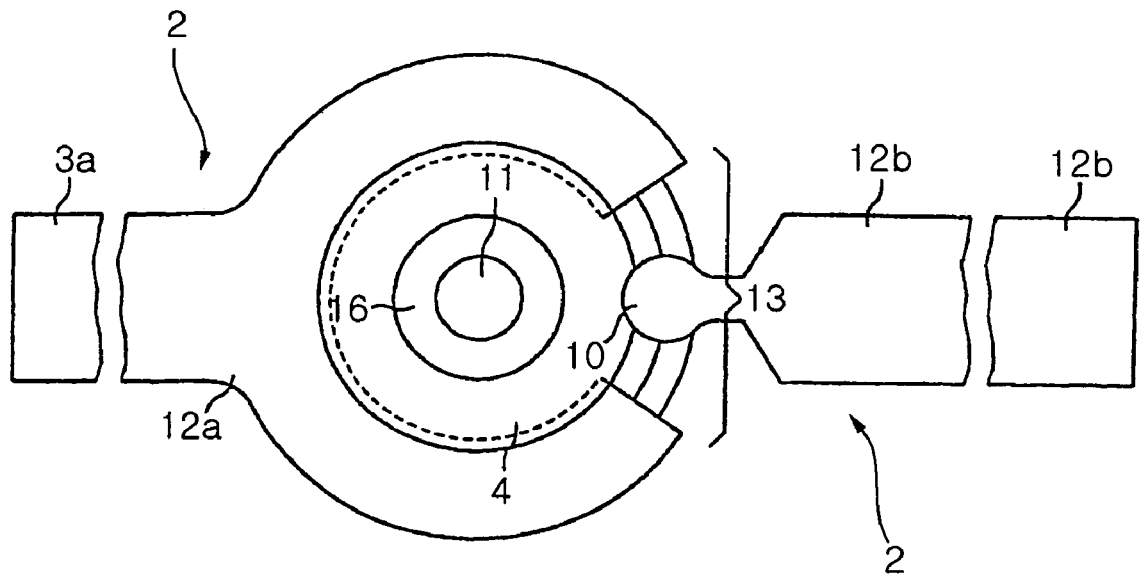
FIG. 2 is a top and side elevational view of a conventional leadframe structure of a high power LED package.
Figure 2B:
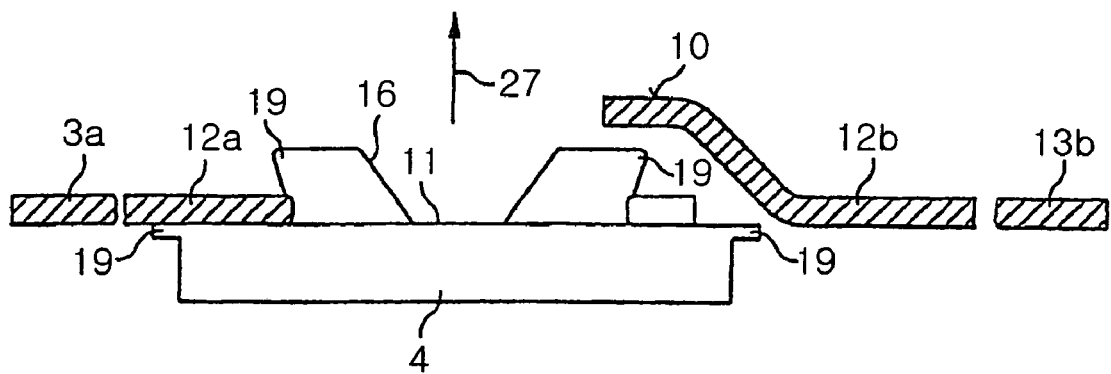

Of course, the shape of the cover 170 is illustrative only, but various types of lenses and covers can be used instead. For example, the dome-shaped lens 22 as shown in FIG. 1 can be used. Furthermore, the transparent encapsulant 180 made of elastic material can be optionally omitted or substituted with other material.

Figure 10:
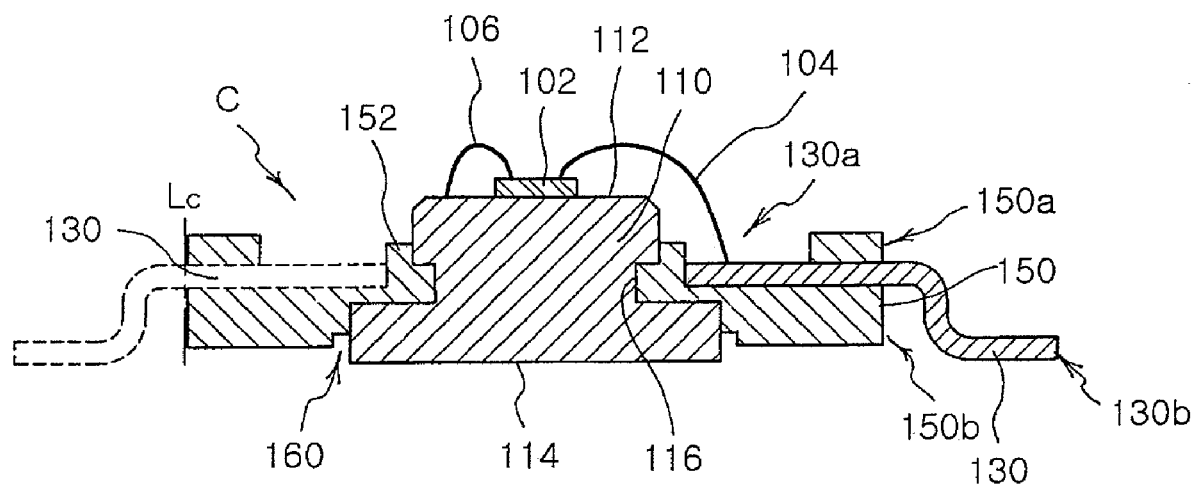
FIG. 10 is a cross-sectional view of another embodiment of the LED housing according to the invention, taken in a section corresponding to FIG. 6.

FIG. 10 illustrates another embodiment of the LED housing according to the invention. Describing the LED housing 100-1 of this embodiment, an LED chip 102 is electrically connected to an electrical connecting part 130 by a wire 104 and to a heat conducting part 110 by a wire 106. In this fashion, the heat conducting part 110 itself functions as a terminal. Then, another heat conducting part 130 shown in dotted line can be omitted or cut along trimming line Lc. Alternatively, it is possible to use the heat conducting part 110 as one terminal but both of the electrical connecting parts 130 as the other terminal. Other construction of the LED housing 100-1 of this embodiment is substantially the same as that of the LED housing 100 of the first embodiment. The same or similar components are designated with the same reference signs and their description will be omitted.

Figure 11:
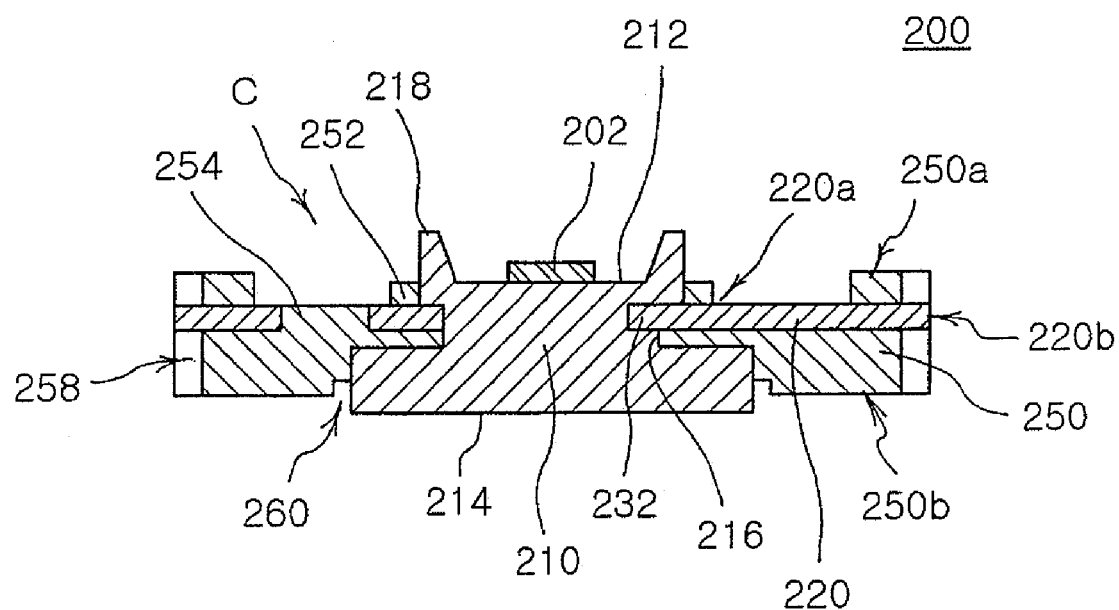
FIG. 11 is a cross-sectional view of further another embodiment of the LED housing according to the invention, taken in a section corresponding to FIG. 5.

FIG. 11 illustrates further another embodiment of the LED housing according to the invention. Describing the LED housing 200 of this embodiment, in a heat conducting part 210, a chip mounting area 212 is protruded at the outer circumference upward to surround an LED chip 202, thereby forming a reflector 218. The inside of the reflector 218 is shaped as a concave mirror in order to reflect light generated by the LED chip 202 in upward direction. Other construction of the LED housing 100-1 of this embodiment is substantially the same as that of the above-described LED housing 100. The same or similar components are designated with the same reference signs by the 200s, and their description will be omitted.

Figure 12:
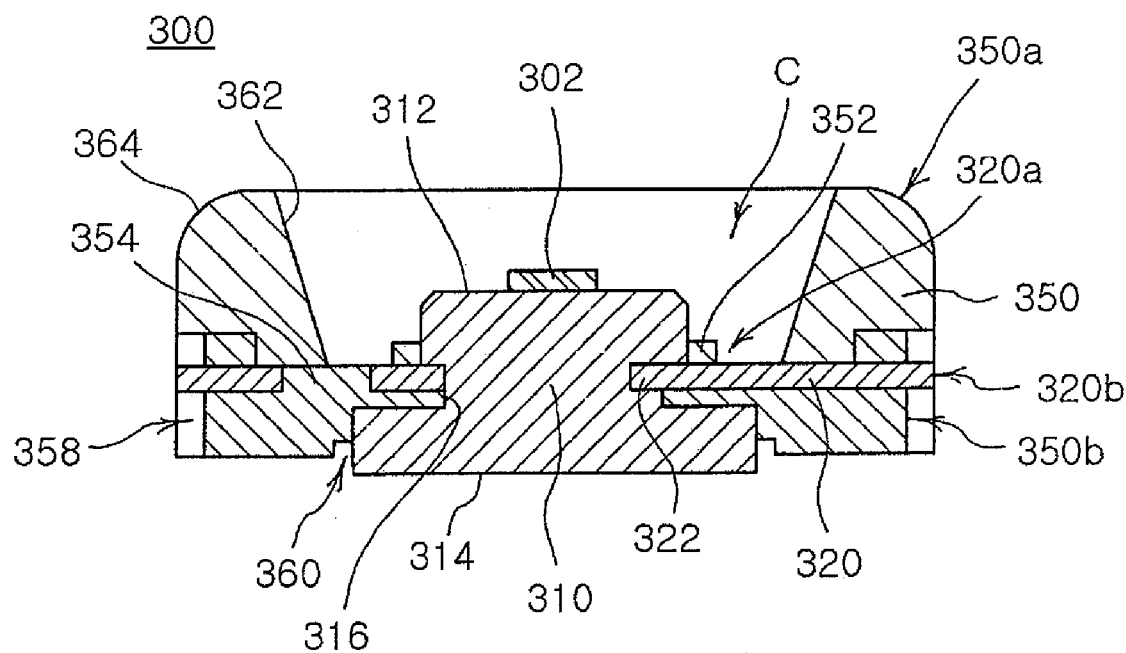
FIG. 12 is a cross-sectional view of other embodiment of the LED housing according to the invention, taken in a section corresponding to FIG. 5.

FIG. 12 illustrates other embodiment of the LED housing according to the invention. Describing the LED housing 300 of this embodiment, a housing body 300 is extended by its outer circumference beyond a chip mounting area 312 of a heat conducting part 310 and an LED chip 302 to form a cavity C around them. The housing body 300 has an inside slope formed around the cavity C and a curved outside surface.

optionally, the housing body 300 may be made of high reflectivity polymer. In this fashion, it is possible to reflect light generated by the LED chip 302 in upward direction by using the slope 362 as a reflecting surface.

For a polymer of a high reflectivity, NM114WA and NM04WA, which are product names of Otsuka Chemical Co., Ltd. can be used. Specifically, NM114WA has an initial reflectivity of 88.3% and maintains a reflectivity of 78.0% after two hours for a wavelength of 470 nm. NM04WA has an initial reflectivity of 89.0% and maintains a reflectivity of 89.0% after two hours for a wavelength of 470 nm. For an excellent reflectivity molding material, those containing TiO2 are known in the art.

Alternatively, the housing body 300 can be made of metal or polymer of a low reflectivity and high reflectivity material can be provided in the form of a film on the slope 362. This film can be realized using metal of a high reflectivity or the above-described polymer of a high reflectivity.

Figure 13:
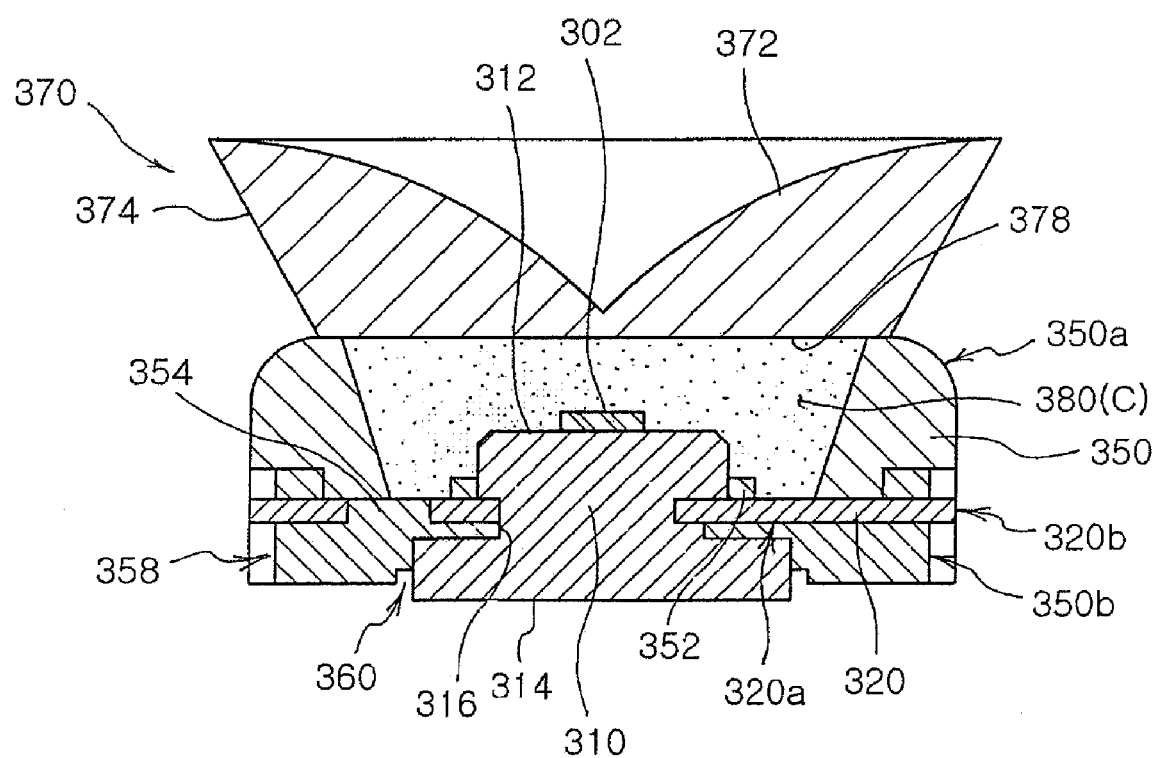
FIG. 13 is a cross-sectional view of a high power LED package of the invention having an LED housing as shown in FIG. 12.

FIG. 13 illustrates a high power LED package of the invention embodied by capping a transparent cover 370 on an LED housing 300 as shown in FIG. 12.

More specifically, a transparent encapsulant 380 is formed in a cavity C of the LED housing 300, and a transparent cover 370 is bonded to the top of the housing 300. The transparent 380 may be made of for example epoxy resin, and preferably, elastic resin as described above.

The transparent cover 370 is provided with a reflecting surface 372 and a radiating surface 374 for radiating reflected light to the outside. The cover 370 is shaped symmetrically about the axis A or rotationally symmetric.

The housing body 300 may also be made of transparent resin. A rounded surface 364 of the housing body 300 functions as a lower radiating surface that radiates light generated from an LED chip 302 in lateral direction. In this fashion, the light radiation pattern produced by the whole LED package is substantially the same as that produced by the LED package of FIG. 9.

A fabrication process of the LED housing 100 of the invention as described above with reference to FIGS. 3 to 7 will now be described with reference to FIGS. 14 to 20.

(1) Preparing Heat Conducting Part and Frame

First, as shown in FIG. 14, a heat conducting part 110 and a frame 140 are prepared.

The heat conducting part 110 is prepared preferably by cutting a metal lump or metal rod. The prepared heat conducting part 110 is configured the same as the heat conducting part 110 of the LED housing 100 as illustrated in FIGS. 3 to 7.

The frame 140 is produced from a sheet metal or metal plate preferably by punching. The produced frame 140 is rectangular, and has a circumference part 142, a pair of fixing parts 120 and a pair of electrical connecting parts 130, in which the fixing parts 120 and the electrical connecting parts 130 are shaped as a lead extended from the circumference part 142 toward the center. Other areas of the frame 140 excluding the fixing parts 120, the electrical connecting parts 130 and the outer circumference 142 are opened, and guide holes 144 are perforated in for corners of the outer circumference part 142.

The guide holes 144 are adapted to locate the frame 140 while maintaining its position. For example, the guide holes 144 serve to receive guide pins of a mold (not shown) when the frame 140 is mounted to the mold in following process.

Each of the fixing parts 120 has a first end 120a with a holder 122 for engaging with the neck 116 of the heat conducting part 110 and the second end 120b led to the outer circumference 142 of the frame 140. The holders 122 are formed with a curvature preferably the same as that of the neck 116 of the heat conducting part 110. Preferably, the first ends 120a of the fixing parts 120 are spaced to a suitable distance so that the holders 122 form a circle matching the neck 116 when connected with arcs of equal curvature. If the neck 116 is angled, the holder 122 will be angled with a corresponding configuration.

(2) Assembling Heat Conducting Part to Frame

Figure 15:
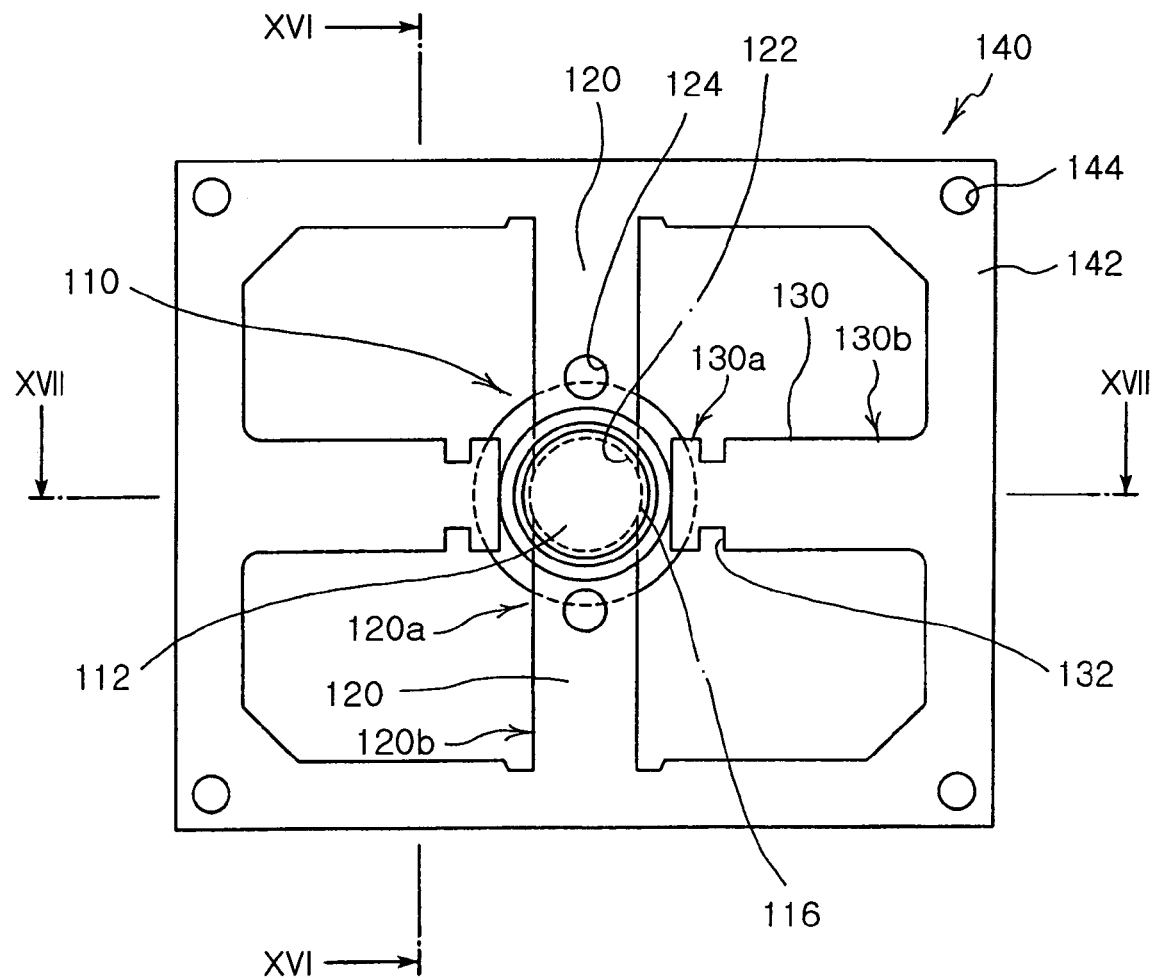
FIG. 15 is a plan view of the heat conducting part and the leadframe shown in FIG. 14, illustrating the heat conducting part assembled with the leadframe.
Figure 16:
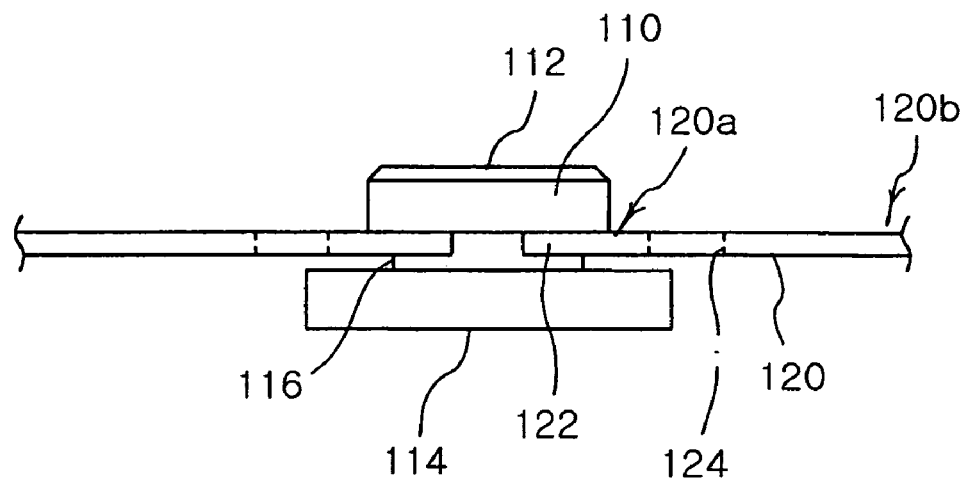
FIG. 16 is a side elevational view seen in the direction of an arrow from the line XVI-XVI in FIG. 15.

The heat conducting part 110 is pushed upward from the position shown in FIG. 14 to be mounted or assembled to the frame 140. The heat conducting part 110 shoves out the fixing parts 120 of the frame 140 as it is moved upward, such that the fixing parts 120 are bent upward and then restore to the original position by the elasticity. Then, the holders 122 of the fixing parts 120 hold the neck 116 at both sides so that the heat conducting part 110 is mounted or assembled to the frame 140. The engagement of the holders 122 with the neck 116 is as shown in FIGS. 15 and 16.

Figure 17:
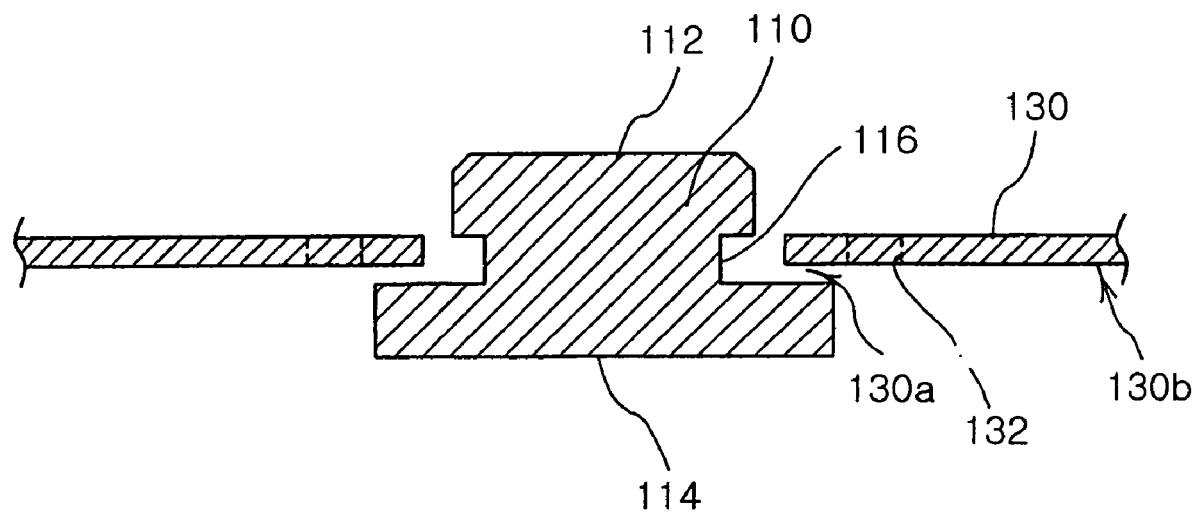
FIG. 17 is a cross-sectional view taken along the line XVII-XVII in FIG. 15.

The first ends 130a of the electrical connecting parts 130 are arranged adjacent to the heat conducting part 110 as shown in FIG. 17. Although the electrical connecting parts 130 are arranged adjacent to the neck 116 and the chip mounting area 112 of the heat conducting part 110, they do not contact the heat conducting part 110 but maintain a distance therefrom.

In this manner, the holders 122 of the fixing parts 120 engage around the neck 116 to fix the heat conducting part 110 to the frame 140 so that the heat conducting part 110 can maintain its position during following process of mold-mounting and resin injection.

(3) Mold Mounting and Resin Injection

Figure 18:
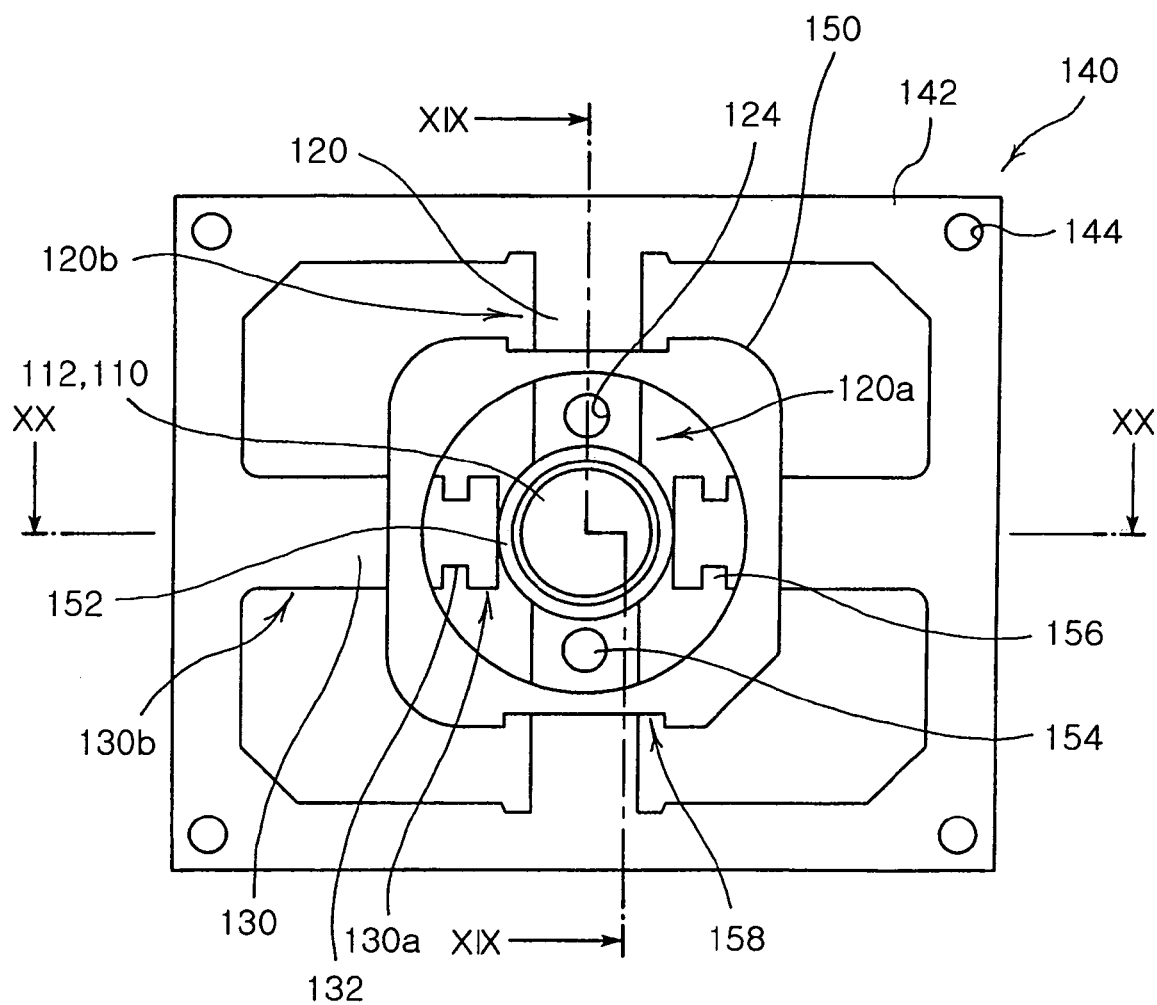
FIG. 18 is a plan view of a housing body formed by molding resin on a structure shown in FIG. 15.

Then, the frame 140 assembled with the heat conducting part 110 is mounted to a mold (not shown) by inserting guide pins of mold into the hole 144 of the frame 140. Next, resin material or encapsulating material is injected into the mold to encapsulate the heat conductive material 110 and frame 140 parts adjacent to the heat conductive material 110, thereby molding a housing body 150 as shown in FIGS. 18 to 20.

Describing in more detail, the housing body 150 is formed by molding to integrally encapsulate a portion of the fixing part 120 adjacent to the first ends 120a thereof and the heat conducting part 110, in which the heat conducting part 110 is encapsulated by the housing body 150 except for the chip mounting area 112 and the heat connecting area 114.

Figure 19:
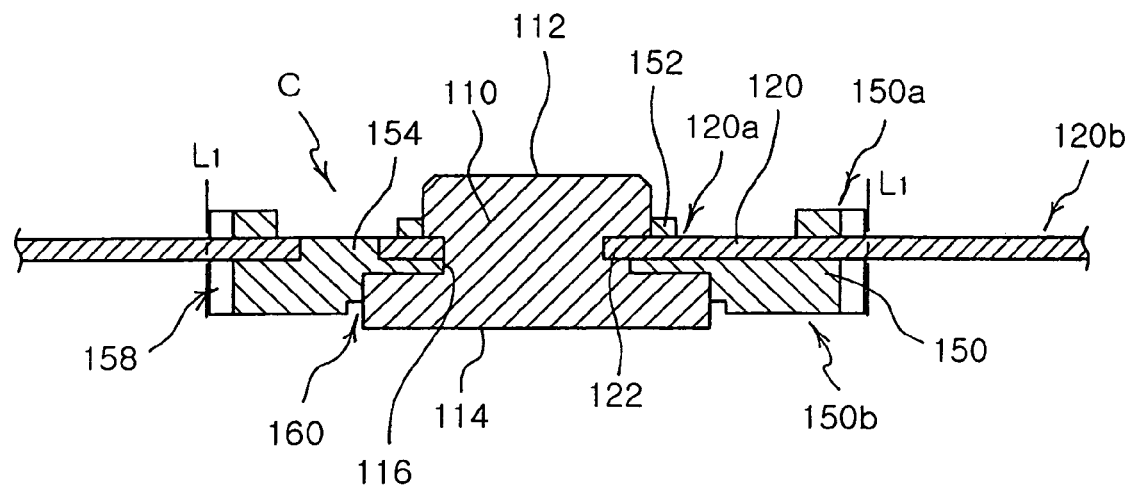
FIG. 19 is a cross-sectional view taken along the line XIX-XIX in FIG. 18.

As shown in FIG. 19, the fixing parts 120 are encapsulated by the housing body 150 with the holders 122 engaged with the heat conducting part 110. The top surface of each fixing part 120 adjacent to the first end 120a is exposed from above by the cavity C of the housing body 150. A middle portion of the fixing part 120 between the first and second ends 120a and 120b is inserted between the upper and lower parts 150a and 150b of the housing body 150, and a portion of the fixing part 120 adjacent to the second end 120b is extended out of the housing body 150. The fixing areas 154 of the housing body 124 are inserted into the holes 124 of the fixing parts 120 so that the fixing parts 120 are tightly coupled with the housing body 150 to securely fix the heat conducting part 110 to the housing body 150.

Figure 20:
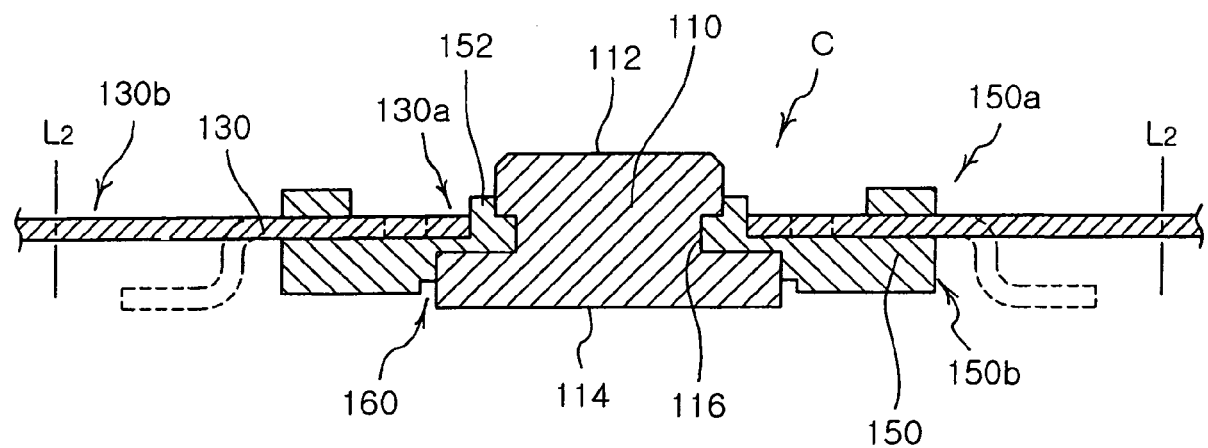
FIG. 20 is a cross-sectional view taken along the line XX-XX in FIG. 18.

As shown in FIG. 20, the top surface of each electrical connecting part 130 adjacent to the first end 130a forming the wire mounting area is exposed from above the cavity C of the housing body 150. A middle portion of the electrical connecting part 130 between the first and second ends 130a and 130b is inserted between the upper and lower pars 150a and 150b of the housing body 150, and a portion of the electrical connecting part 130 adjacent to the second end 130b is extended out of the housing body 150. The fixing portions 156 of the housing body 150 are inserted into the indentations 132 of the electrical connection parts 130 thereby securely coupling the electrical connecting parts 130 so that the electrical connecting parts 130 do not slip out of the housing body 150 under external force.

A resultant structure produced by resin molding as above has substantially the same configuration as the LED housing 100 illustrated in FIGS. 3 to 7 except that the fixing parts 120 and the electrical connecting parts 130 are still connected to the frame 140 and the electrical connecting parts 130 are not bent at the second ends 130.

(4) Separating from Frame

When resin is cured, the above-mentioned resultant structure is taken out of the mold, the fixing parts 120 are cut along the line L1 shown in FIG. 19, and the electrical connecting pars 130 are cut along the line L2 shown in FIG. 20 to separate the resultant structure shown in FIGS. 18 to 20 from the frame 140. Then, the electrical connecting parts 130 are bent at the second ends 130a as shown in FIG. 20, thereby producing an LED housing 100 as shown in FIG. 3 to 7. Alternatively, the step of taking the resultant structure out of the mold can be carried out the cutting and bending.

Packaging

The LED housing 100 produced as above can be used to accomplish an LED package for example as shown in FIG. 9.

First, an LED chip 102 is attached to the chip mounting area 112 by for example adhesive and electrically connected to the electrical connecting parts 130 by wires 104 so as to produce a structure as shown in FIG. 8.

Then, the structure is coupled with for example a transparent cover 170 as shown in FIG. 9. In the coupling, the cover 170 is turned upside down, transparent encapsulant 180 of for example silicone is filled into a hollow space of the cover 170, and then the LED housing 100 is turned upside down and placed on the cover 170 with the LED chip 102 facing downward. As the transparent encapsulant 180 is cured from this state, the LED package as shown in FIG. 9 can be produced.

Process on Frame Array Sheet

Figure 21:
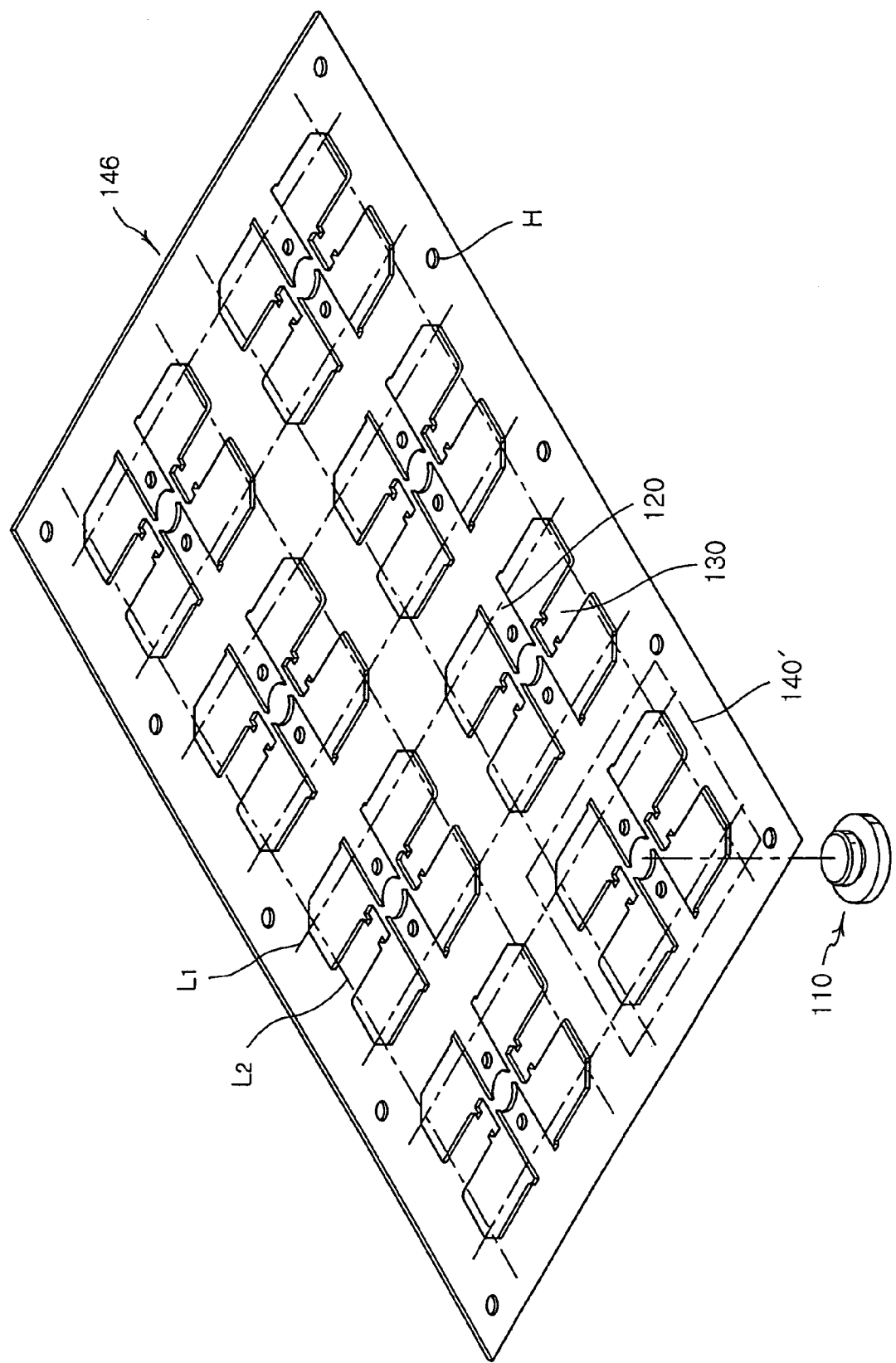
FIG. 21 is an exploded perspective view of another fabrication process of a high power LED housing according to the invention, illustrating a frame sheet having a number of leadframe areas corresponding to the leadframe shown in FIG. 14.

FIG. 21 shows a frame array sheet 146 having a plurality of frame areas 140' arrayed therein. Each frame area 140' is shaped substantially the same as the afore-described frame 140.

Therefore, the frame array sheet 146 can be used to produce a number of LED housing bodies 150 in the plurality of frame areas 140' according to the same process as described above, in which holes H formed in the periphery of the frame array sheet 146 are used as guide holes or locating holes.

After forming the LED housings 100 according to the above process, the frame array sheet 146 is cut along trimming lines L1 and L2 and the second ends 130a of the electrical connecting ends 130a are bent so as to accomplish a plurality of LED housings 100. Alternatively, the LED housings 100 can be taken out of the mold after the cutting and bending.

As described above, the above process allows the plurality of LED housings 100 to be automatically produced by using one frame array sheet 146.

The afore-described process fabrication of an LED housing and an LED package having the same LED housing can be applied equally to fabrication of the LED housing 100 of the first embodiment as well as the LED housings 100-1 and 200 of the second and third embodiments.

In case of the fourth embodiment, this fabrication process is equally applied to fabrication of the LED housing 300, but there differs in coupling the cover 370 to the LED housing 300. In the LED housing 370 of the fourth embodiment, transparent encapsulant 380 is filled into the cavity C beforehand as illustrated in FIG. 13, followed by coupling the transparent cover 370 with the top of the encapsulant 380.

As described hereinbefore, the LED housing of the invention has the pair of fixing parts securely fixing the neck of the heat conducting part at both sides, thereby stably coupling the heat conducting part to the housing body made of resin. Furthermore, the fixing parts also function to spread heat from the heat conducting part to lateral regions of the LED housing, thereby more efficiently spreading heat within the LED housing.

Besides, the fabrication process of an LED housing of the invention can easily and stably produce an LED housing by carrying out resin-molding with a heat conducting part fixedly inserted into a pair of fixing parts to form a housing body, and after curing of resin, taking the housing out of a mold. Moreover, by using a frame with the fixing parts and electrical connecting parts formed therein as means for fixing the heat conducting part, the fabrication process can be automated in order to save cost and improve productivity.

Although the invention has been shown and described with reference to certain preferred embodiments thereof, it will be understood by those skilled in the art that various changes in form and details may be made therein without departing from the spirit and scope of the invention as defined by the appended claims.

What is claimed is:

1. An light emitting diode housing comprising:
    a heat conducting part having:
        a chip mounting area for mounting a light emitting diode chip;
        a heat connecting area opposed to the chip mounting area; and
        a neck that is formed between the chip mounting area and the heat connecting area, the neck having a groove formed around the heat conducting part;
    a pair of fixing parts configured to fix the heat conducting part, each fixing part having a holder formed at a first end engaged with the neck of the heat conducting part, the holder being inserted into the groove formed in the neck;
    an electrical connecting part having a wire connecting area placed adjacent to the chip mounting area of the heat conducting part and an external power connecting area connected to the wire connecting area; and
    a housing body of molding material integrally holding the heat conducting part, the fixing parts and the electrical connecting part while isolating the electrical connecting part from the heat conducting part and the pair of fixing parts,
    wherein the electrical connecting part and the heat conducting part are configured as a first terminal and second terminal, respectively.

2. The light emitting diode housing according to claim 1, wherein the first end of the fixing parts is adapted to hold around the neck.

3. The light emitting diode housing according to claim 1, wherein the fixing parts have a hole for receiving a portion of the housing body.

4. The light emitting diode housing according to claim 1, wherein the fixing parts each have a second end extended to a side surface of the housing body to spread heat from the heat conducting part in lateral direction of the housing body.

5. The light emitting diode housing according to claim 4, wherein the housing body has a caved-in side portion so that the second ends of the fixing parts are projected out of the housing body.

6. The light emitting diode housing according to claim 1, wherein the housing body has a cavity configured to expose the chip mounting area of the heat conducting part and the wire connecting area of the electrical connecting part.

7. The light emitting diode housing according to claim 6, wherein the housing body has a step connected around the chip mounting area of the heat conductive area within the cavity.

8. The light emitting diode housing according to claim 1, wherein the housing body has a groove connected around the heat connecting area of the heat conducting part.

9. The light emitting diode housing according to claim 1, wherein the holder is curved inward with a curvature corresponding to an outer surface of the neck.

* * * * *